(12) United States Patent
Shimizu

(10) Patent No.: US 6,670,666 B2
(45) Date of Patent: Dec. 30, 2003

(54) NONVOLATILE SEMICONDUCTOR MEMORY DEVICE AND MANUFACTURING METHOD THEREOF

(75) Inventor: Satoshi Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/139,744

(22) Filed: May 7, 2002

(65) Prior Publication Data
US 2003/0020109 A1 Jan. 30, 2003

(30) Foreign Application Priority Data

Jul. 25, 2001 (JP) .......................... 2001-224571

(51) Int. Cl.[7] .............................. H01L 21/336
(52) U.S. Cl. .................. 257/298; 257/296; 257/302; 257/315
(58) Field of Search ................... 257/296, 298, 257/302, 315; 438/211, 524, 701

(56) References Cited

U.S. PATENT DOCUMENTS

| | | | |
|---|---|---|---|
| 5,998,301 A | * | 12/1999 | Pham et al. ............ 438/701 |
| 6,265,292 B1 | * | 7/2001 | Parat et al. ............ 438/524 |
| 6,436,751 B1 | * | 8/2002 | Liou et al. ............ 438/211 |
| 6,534,367 B2 | * | 3/2003 | Peake et al. ............ 438/270 |

FOREIGN PATENT DOCUMENTS

| | | |
|---|---|---|
| JP | 2000-36546 | 2/2000 |
| JP | 2000-91545 | 3/2000 |

* cited by examiner

Primary Examiner—Hoai Ho
Assistant Examiner—Dao H. Nguyen
(74) Attorney, Agent, or Firm—McDermott, Will & Emery

(57) ABSTRACT

A non-volatile semiconductor memory device has, at a main surface of a semiconductor substrate, an uneven shape with recesses and protrusions repeated continuously and alternately and further includes a source diffusion layer region having a source region formed from an upper surface of each protrusion to the depth direction of the semiconductor substrate and a source diffusion layer interconnection formed from a bottom surface of the recess to the depth direction of the semiconductor substrate when the semiconductor substrate is viewed two-dimensionally. The depth of the bottom surface of the source region from the upper surface of the protrusion is made equal to or larger than the depth of the bottom surface of the recess from the upper surface of the protrusion. Thus, a non-volatile semiconductor memory device is provided which is suitable for miniaturization and in which resistance of the source diffusion layer region can easily be lowered.

3 Claims, 6 Drawing Sheets

NONVOLATILE SEMICONDUCTOR MEMORY DEVICE AND MANUFACTURING METHOD THEREOF

BACKGROUND OF THE INVENTION

1. Field of the Invention

The present invention relates to a non-volatile semiconductor memory device and, more specifically, to a structure of a source diffusion layer region of a non-volatile semiconductor memory device and to a manufacturing method thereof.

2. Description of the Background Art

As a method of isolating each cell region of a non-volatile semiconductor memory device represented by a conventional flash memory, element isolating structure utilizing formation of an isolation film through LOCOS (local oxidation of silicon) process has been dominant. The LOCOS isolation, however, has a limit in miniaturization of the semiconductor devices, and hence STI (Shallow Trench Isolation) comes to be widely used recently. In STI, a trench is formed at a main surface of a semiconductor substrate and filled with a burying oxide film, so as to establish element isolation.

A non-volatile semiconductor memory device having a common trench isolation suffers from a problem that a source diffusion layer region comes to have high resistance when self align source etching is performed utilizing anisotropic dry etching. In a non-volatile semiconductor memory device using LOCOS isolation, an end portion of an isolation film has moderate inclination. Therefore, a source diffusion layer interconnection of low resistance is formed between respective sources at the time of ion implantation, and therefore, such a problem does not arise. In the trench isolation described above, a sidewall of the trench formed at the main surface of the semiconductor substrate has a steep inclination of approximately 90°. Therefore, it has been difficult to form a source diffusion layer interconnection of low resistance on the sidewall during ion implantation.

In the following, a structure of a non-volatile semiconductor memory device employing the conventional trench isolation as well as the problem mentioned above will be described in greater detail. FIG. 6 is a top view representing a structure of a conventional non-volatile semiconductor memory device, and FIGS. 7 to 10 are cross sections showing various portions of the non-volatile semiconductor memory device.

In the non-volatile semiconductor memory device, when the main surface of the semiconductor is viewed from above, cells forming a memory portion are arranged in a matrix. Along a bit line (BL) direction of the cells arranged in a matrix, a plurality of trench isolation regions 17 are formed as stripes parallel to each other at the main surface of a semiconductor substrate 1. Along a word line (WL) direction, gate regions 15 are formed at the main surface of the semiconductor substrate 1. The gate region 15 includes a floating gate 5 and a control gate 6. A source diffusion layer region 2 and a drain region 4 are formed sandwiching the gate region 15. Drain region 4 is electrically isolated by the above described trench isolation region 17. A drain electrode 12 for taking out electrical charges is formed in each drain region 4. Source diffusion layer region 2 is constituted by individual source regions 2a arranged along the word line direction electrically connected with each other by source diffusion layer interconnections 2b. Source diffusion layer interconnection 2b is formed by removing an isolation film positioned between individual source regions 2a by etching so as to expose a trench surface of semiconductor substrate 1, and by performing ion implantation to the thus exposed trench surface of semiconductor substrate 1. Thus, the source regions 2a aligned in the word line direction are electrically coupled, so that all have the same potential. The aforementioned floating gate 5 is arranged independently for each cell, between source region 2 and drain region 4.

Cross sectional structures of respective regions will be described in detail in the following. First, FIG. 7 is a cross section taken along the line VII—VII of FIG. 6. Referring to the figure, the main surface of the semiconductor in the source diffusion layer region 2 has recesses and protrusions. This shape results from the above described process in which a trench isolation film 17 provided at the main surface of semiconductor substrate 1 is removed to expose the trench portion. Source diffusion layer region 2 continuously extends immediately below the surface of the recesses and protrusions. Further, an interlayer insulating film 11 is formed to cover the main surface of semiconductor substrate 1.

FIG. 8 is a cross section taken along the line VIII—VIII of FIG. 6. Referring to this figure, drain regions 4 of the cells are isolated by trench isolation 17 from each other, and on each drain region 4, a drain electrode 12 is formed. Different from the above described source region 2a, drain regions 4 aligned in the word line direction are electrically independent from each other, and therefore, electric charges are taken out from each drain region 4 through drain electrode 12.

FIG. 9 is a cross section taken along the line IX—IX of FIG. 6. Referring to the figure, in the cross section of semiconductor substrate 1 along the direction of extension of a gate region 15, a channel 8 is formed at the main surface of the semiconductor substrate 1 sandwiched between trench isolation regions 17, and a floating gate 5 is positioned with a thin tunnel oxide film 18 interposed, on the channel 8. An upper surface of floating gate 5 is covered by a control gate 6 with a thin ONO (oxide nitride oxide) film 20 interposed, thus providing a capacitance. Further, at an upper portion of control gate 6, a gate electrode 7 is formed for taking out electrical charges from the control gate.

FIG. 10 is a cross sectional view taken along the line X—X of FIG. 6. Referring to the figure, in the cross section along the bit line direction of the non-volatile semiconductor memory device, source regions 2a and drain regions 4 are arranged alternately at the main surface of semiconductor substrate 1, and between each of these regions, a channel 8 is positioned. Immediately above the channel 8, a floating gate 5 is positioned with a thin tunnel oxide film 18 interposed, and on an upper surface of floating gate 5, control gate 6 and gate electrode 7 are positioned, with the aforementioned ONO film 20 interposed. The non-volatile semiconductor memory device having such a structure is thus formed.

The method of forming the source diffusion layer region in the non-volatile semiconductor memory device having the above described structure is as follows. FIGS. 11A and 11B are cross sections representing the method of forming the non-volatile semiconductor memory device having the above described structure. First, a trench is formed at the main surface of semiconductor substrate 1, the trench is filled with an isolation film to form a trench isolation region 17, and the isolation film of that portion of the trench isolation region 17 which overlaps the source diffusion layer region 2 is removed by self align source etching.

Consequently, the main surface of semiconductor substrate 1 at a portion that will be source diffusion layer region 2 comes to have such a cross sectional structure as shown in FIG. 11A, which includes recesses and protrusions.

Thereafter, an n type impurity such as arsenic is ion-implanted to the portion that will be source diffusion layer region 2, from a direction approximately at a right angle with the main surface of semiconductor substrate 1 (from the direction of the arrow D in the figure). As the upper surface of the protrusions are positioned approximately at a right angle with respect to the direction of ion implantation, a deep source region 2a is formed immediately therebelow. Further, as the bottom surface of the recesses is positioned approximately at a right angle with respect to the direction of ion implantation, a deep source diffusion layer interconnection 2b1 is formed immediately therebelow. A sidewall of the recessed portion formed by removing trench isolation described above has an inclination angle of approximately 90°. Therefore, implanted ions do not much diffuse, and hence only a shallow source diffusion layer interconnection 2b2 is formed at the surface. As these source regions are formed continues to each other, a so-called source line is formed (FIG. 11B). When the sidewall of the recessed portion is particularly steep, the source diffusion layer interconnection 2b2 is not formed at the sidewall portion, resulting in a discontinuous source line.

In the non-volatile semiconductor memory device described above, the main surface of the semiconductor substrate has recesses and protrusions at the cross section of the source diffusion layer region. Therefore, it is difficult to introduce ions to the sidewalls of the trenches by conventional vertical ion implantation to the main surface of the semiconductor substrate, so that the source diffusion layer region comes to have an unstable and discontinuous structure, of which resistance becomes high. Because of this high resistance, voltage drops as a current flows through the source diffusion layer region, and therefore, at a cell positioned far from a portion where the potential of the source region is fixed, efficiency of writing decreases. Further, a threshold voltage Vth becomes lower in order to obtain read current at the time of erasure, resulting in excessive erasure.

Japanese Patent Laying-Open No.2000-36546 discloses a structure in which a trench sidewall is formed with an angle larger than the angle of ion implantation to provide a source diffusion layer region of low resistance. This method, however, is disadvantageous to miniaturization of the semiconductor device, as the trench sidewall is inclined. Though it is described in this reference that the angle of ion implantation is set to 7°, such setting is specified simply to improve implantation efficiency by preventing piercing of the ions, and not to lower the resistance of the source diffusion layer region.

Japanese Patent Laying-Open No. 2000-91545 discloses a technique in which a trench is formed as two-stepwise trench so as to lower the resistance of the source diffusion layer region. Such a structure, however, significantly increases the number of process steps, and hence increases manufacturing cost.

SUMMARY OF THE INVENTION

An object of the present invention is to provide a non-volatile semiconductor memory device having such a structure that does not limit miniaturization even when trench isolation suitable for miniaturization is used and that can lower resistance of a source diffusion layer region with the number of process steps not much increased, and to provide a manufacturing method thereof.

The non-volatile semiconductor memory device in accordance with the present invention has a source diffusion layer region formed continuously at a main surface of the semiconductor substrate, wherein the main surface of the semiconductor substrate at the source diffusion layer region has recesses and protrusions repeated continuously and alternately in a cross section parallel to a direction of extension of the source diffusion layer region; the source diffusion layer region includes, when the semiconductor substrate is viewed two-dimensionally, a first source diffusion layer region formed from an upper surface of each protrusion toward the depth direction of the semiconductor substrate and a second source diffusion layer region formed, when the semiconductor substrate is viewed to-dimensionally, from a bottom surface of each recess toward the depth direction of the semiconductor substrate; and depth from the upper surface of the protrusion to the bottom surface of the first source diffusion layer region is the same as or larger than the depth from the upper surface of the protrusion to the bottom surface of the recess.

Because of this structure, the source diffusion layer region surely becomes continuous and comes to have a large cross sectional area in the cross section vertical to the direction of extension thereof. Thus, the source diffusion layer region comes to have lower resistance. Further, as the source diffusion layer region extends down to the bottom surface of the protrusion, source regions are coupled through shortest path with each other, which leads to further decrease of the resistance of the source diffusion layer region.

Desirably, in the non-volatile semiconductor memory device of the present invention described above, in a first source diffusion layer region, for example, impurity concentration distribution of a linear portion coupling lower ends of sidewalls of each protrusion has one peak between a mid point of the linear portion and one of the lower ends, and another peak between the mid point and the other lower end.

By controlling conditions of ion implantation to realize the above described feature, a source diffusion layer region can be formed which is surely continuous at the end portions and at the middle portion of the protrusion.

In the non-volatile semiconductor memory device described above, in the first source diffusion layer region for example, the impurity concentration distribution of the linear portion connecting the lower ends of sidewalls forming each protrusion may have a peak near the mid point thereof.

By controlling conditions of ion implantation to realize the above described feature, a source diffusion layer region which is surely continuous at the end portions and at the middle portion of the protrusion is formed.

In the non-volatile semiconductor memory device of the present invention described above, the protrusions and recesses at the main surface of the semiconductor substrate may be formed by trench isolation.

The present invention is particularly effective when the recesses and protrusions at the main surface of the semiconductor substrate are steep recesses and protrusions formed by using trench isolation. Even when LOCOS process is used for isolation, application of the present invention is effective if end portions of the isolation film is formed steep.

A method of manufacturing a non-volatile semiconductor memory device in accordance with the present invention is for manufacturing a nonvolatile semiconductor memory device having a source diffusion layer region formed continuously at the main surface of a semiconductor substrate, which includes: a first step of forming a plurality of element isolating regions parallel to each other by forming isolation films at the main surface of the semiconductor substrate; a second step of removing the isolation films at portions that will be source diffusion layer regions among the element isolating regions to provide recesses and protrusions at the main surface of the semiconductor substrate; and a third step of oblique ion implantation under such a condition that in a cross section parallel to a direction of extension of the source diffusion layer region, a mid point of a line connecting lower ends of sidewalls of each protrusion forms a part of the source diffusion layer region.

By the above described manufacturing method, the structure described above can be obtained. More specifically, ions introduced to an arbitrary one point at the main surface of the semiconductor substrate in the third step radially expands from this point as a center, and forms the source diffusion layer region. By performing oblique ion implantation under such a condition that ions introduced to the lower end of the sidewall of each protrusion reach the middle point of the line connecting the lower ends of the sidewall of the protrusion, the depth of the bottom surface of the first source diffusion layer region mentioned above surely becomes deeper than the bottom surface of the recessed portion. Accordingly, the resistance of the source diffusion layer region can be significantly lowered as compared with the prior art.

Desirably, the third step of the method of manufacturing a nonvolatile semiconductor memory device in accordance with the present invention includes: the step of ion implantation obliquely from above to the main surface of the semiconductor substrate at an angle smaller than an acute one of the angles formed by a line connecting a lower end of one sidewall of each recess and an upper end of the opposite sidewall of the recess with a line vertical to the main surface of the semiconductor substrate, to form a part of the source diffusion layer region; and a step of ion implantation obliquely to the main surface of the semiconductor substrate from a direction in line-symmetry with the vertical line being the axis, at the same angle as the former ion implantation, to form remaining part of the source diffusion layer region.

By performing oblique ion implantation twice to the sidewalls of the protrusion as in the present method of manufacturing, the source diffusion layer region can surely be formed in the protrusion. The twice oblique ion implantation operations of the fixed type should desirably be performed from directions in line-symmetry with the vertical line to the main surface of the semiconductor substrate being the axis of symmetry.

The method of manufacturing a non-volatile semiconductor memory device of the present invention may additionally include a step of introducing ions approximately vertically to the main surface of the semiconductor substrate.

This additional step ensures formation of the source diffusion layer region. This method of manufacturing is effective when deeper source diffusion layer regions are to be formed at the upper surface of the protrusions and the bottom surface of the recesses.

In the method of manufacturing a non-volatile semiconductor memory device of the present invention, the method of forming an isolation film in the first step, for example, may be trench isolation.

When the method of forming the insulating film is trench isolation as in the manufacturing method described above, steep recesses and protrusions are formed, and therefore, application of the present invention is particularly effective. Even when the method of forming an isolation film utilizing LOCOS process is used, application of the present invention is effective particularly when the recesses and protrusions are steep.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
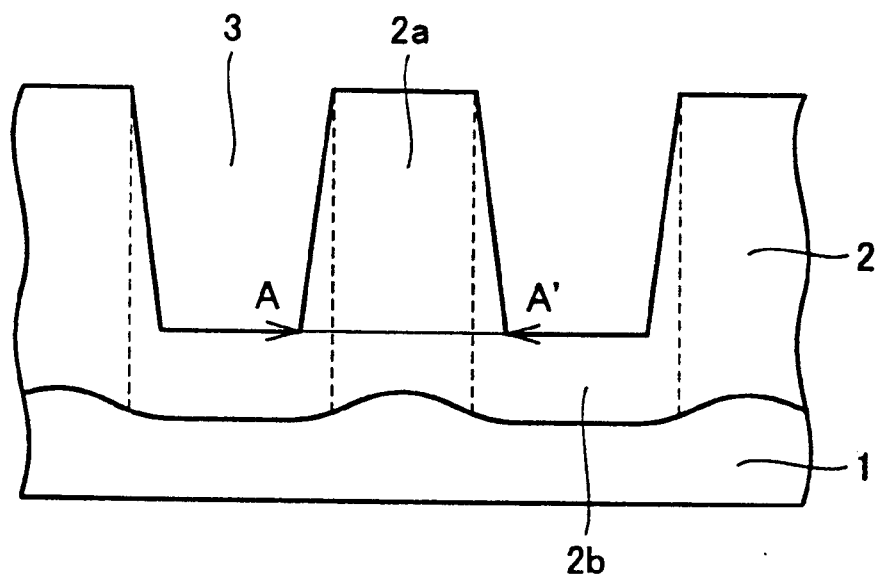
FIG. 1 is a cross section along the word line direction of a non-volatile semiconductor memory device after the step of forming source diffusion layer region in accordance with an embodiment of the present invention.
Figure 2:
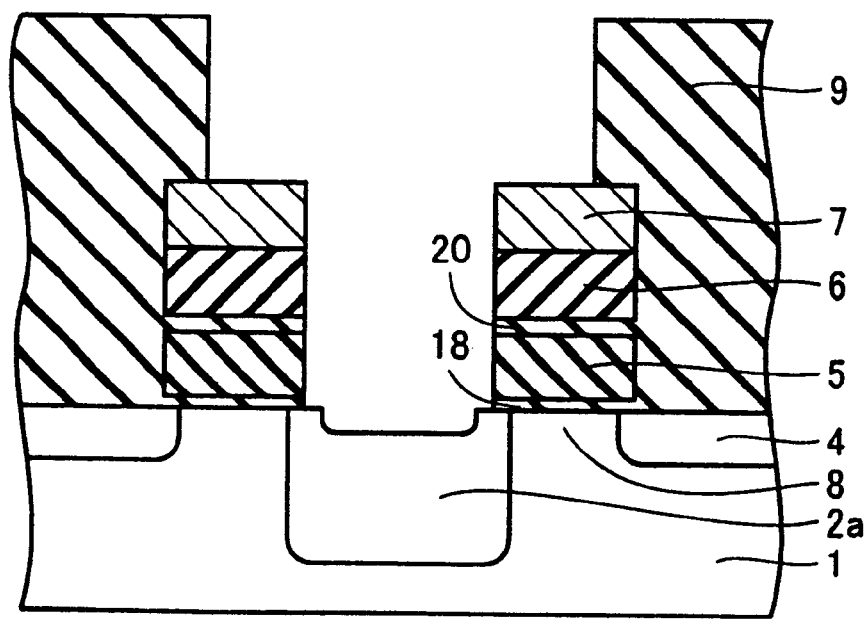
FIG. 2 is a cross section taken along the bit line direction of the non-volatile semiconductor memory device after the step of forming source diffusion layer region in accordance with an embodiment of the present invention.

The structure of a non-volatile semiconductor memory device in accordance with an embodiment of the present invention will be described with reference to FIGS. 1 and 2. The non-volatile semiconductor memory device in accordance with the present embodiment has the same structure as the conventional non-volatile semiconductor memory device described above except for the structure of the source diffusion layer region. Therefore, corresponding portions are denoted by the same reference characters and description thereof will not be repeated.

In the cross section of a channel region along the bit line direction of the non-volatile semiconductor memory device in accordance with the present embodiment, source region 2a as first source diffusion layer region and drain region 4 are formed alternately at a main surface of a semiconductor substrate 1. Between source region 2a and drain region 4, a channel 8 is formed, and on the main surface of semiconductor substrate 1 above the channel 8, a floating gate 5 of polysilicon is positioned with a tunnel oxide film 18 interposed. A control gate 6 and a gate electrode 7 are further formed thereon, with an ONO film 20 interposed. Here, in the non-volatile semiconductor memory device in accordance with the present embodiment, the depth of source region 2a is significantly deeper than the drain region 4 from the main surface of semiconductor substrate 1.

In a cross section of the source diffusion layer region 2 in a direction parallel to the word lines, the main surface of the semiconductor substrate 1 has recesses and protrusions formed by trenches 3 provided in the step of forming an isolation film. Source diffusion layer region 2 is formed from the main surface of semiconductor substrate 1 having the recesses and the protrusions to the depth direction. Though source diffusion region 2 is formed continuously, let us divide the layer into a source region 2a as the first source diffusion layer region extending from an upper surface of each protrusion in the depth direction of the semiconductor substrate and a source diffusion layer interconnection 2b as the second source diffusion layer region extending from the sidewalls and bottom surface of each recess in the depth direction of the semiconductor substrate, for convenience of description. In the non-volatile semiconductor memory device of the present embodiment, the highest portion of the bottom surface of source region 2a is positioned deeper than the bottom surface of the recess of the main surface of semiconductor substrate 1. Accordingly, the protrusions on the main surface of semiconductor substrate 1 all function as the source regions 2a, and source diffusion layer interconnections 2b provide deep source regions in the depth direction of the main surface of the semiconductor substrate 1. The highest portion of the bottom surface of source region 2a may be of the same height as the bottom surface of the recesses.

Figure 3A:
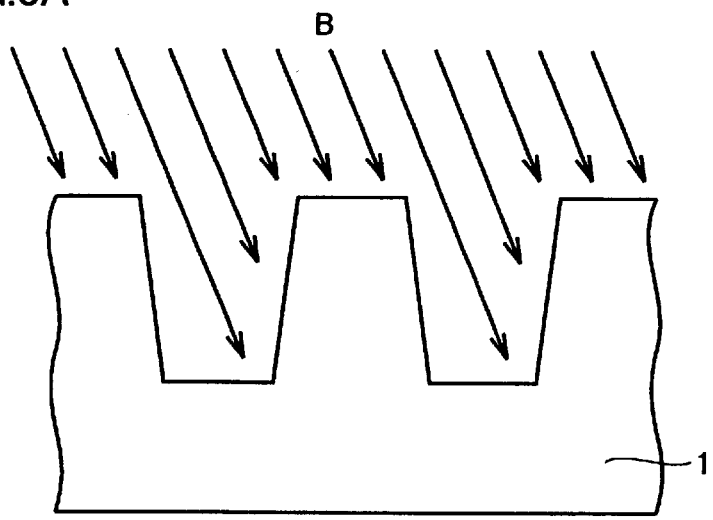
FIGS. 3A to 3C are cross sections representing the method of forming the source diffusion layer region in accordance with an embodiment of the present invention.
Figure 3B:
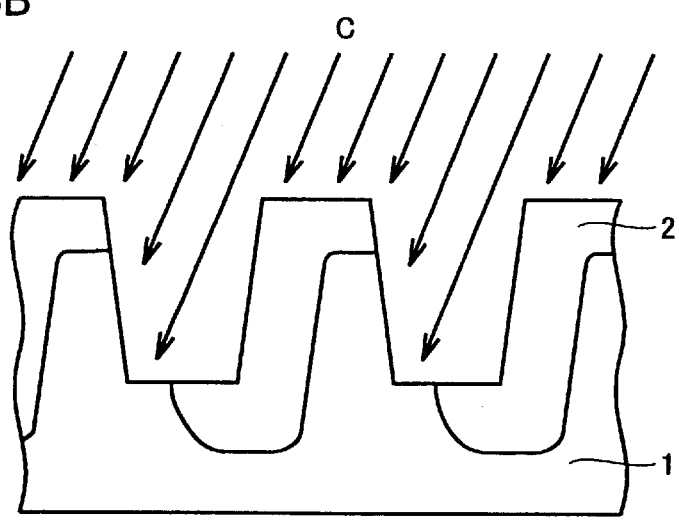
Figure 3C:
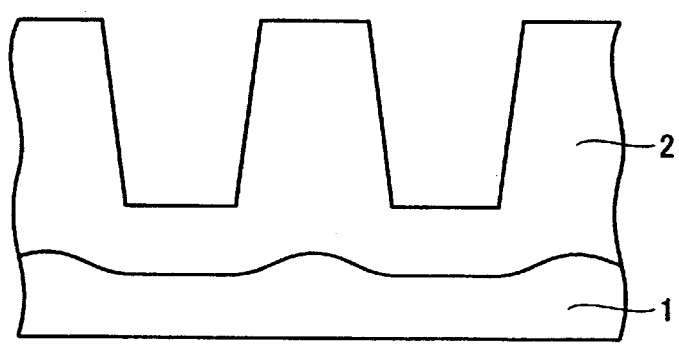

The method of manufacturing a non-volatile semiconductor memory device in accordance with the present embodiment will be described with reference to FIGS. 3A to 3C. In the present embodiment, in order to simplify the process steps, ion implantation of fixed type is performed twice under the same ion implantation condition, for forming the source diffusion layer region.

First, isolation film at those portions of the trench isolation regions 17 formed at the main surface of semiconductor substrate 1 which overlap the source diffusion layer region 2 is removed by anisotropic dry etching. Thereafter, ion implantation is performed obliquely to the main surface of the semiconductor substrate having recesses and protrusions, that is to be the source diffusion layer region 2 (in the direction of the arrow B in FIG. 3A). The direction of ion implantation here is a direction inclined from a plane that is perpendicular to the main surface of the semiconductor substrate and vertical to the direction of extension of that portion which will be the source diffusion layer region 2, and the angle of inclination is smaller than an acute one of the angles formed by a line connecting a lower end of one sidewall of each recess and an upper end of the opposite sidewall of the recess forms with the vertical line of the main surface of the semiconductor substrate 1. As the condition of ion implantation, it is necessary that a mid point of a line connecting lower ends of sidewalls of each protrusion of the main surface of semiconductor substrate 1 is in the source region 2a. Specifically, ion implantation is performed to satisfy the following target conditions, here Rp represents range in the horizontal direction, $\Delta$Rp represents standard deviation of the implanted ions at the main surface of the semiconductor substrate, and Wbottom represents the width of the bottom surface of the protrusion at the source diffusion layer region 2:

(i) When $0 \leq 2Rp \leq Wbottom$,
Wbottom $\leq 2(Rp+3\Delta Rp)$, or
(ii) When Wbottom $< 2Rp \leq 2Wbottom$,
Wbottom $\geq 2(Rp-3\Delta Rp)$.

In order that the mid point is within the source region 2a, ion implantation must be performed such that concentration is higher than the well concentration of opposite type (well concentration of the base substrate) formed in advance in the semiconductor substrate 1. The range of ions of ion implantation approximates to Gaussian distribution, and (Rp$\pm 3\Delta$Rp) is generally known as a range in which most of the ions exist.

Thereafter, ion implantation is performed with the semiconductor substrate 1 rotated by 180° in the horizontal direction, so as to enable ion implantation under the same condition as described above from the direction opposite to the former implantation (in the direction represented by the arrow C in FIG. 3B), so as to enable ion implantation to the sidewalls of the recesses opposite to the sidewalls to which ions have already been implanted. Consequently, ions implanted from opposite directions of the protrusion intersect at the mid point of the line connecting lower ends of the sidewalls of the protrusion, whereby a continuous source diffusion layer region 2 is formed (FIG. 3C). As the non-volatile semiconductor memory device having the above described structure is manufactured by this method, the source diffusion layer region is formed continuously from the main surface of the semiconductor substrate to a deep position, surely by oblique ion implantation, whereby the source regions can be connected with the shortest distance, and the resistance can be decreased. Further, by oblique implantation, the source diffusion layer region having large cross sectional area can be formed, and hence, the resistance can be decreased. Further, as the oblique ion implantation described above is performed twice, the structure of the present embodiment is provided. By the twice oblique ion implantation operations, the resistance can significantly be lowered in the source diffusion layer region as compared with the conventional vertical implantation. Regardless of the shape of protrusions and recesses, it is possible to form a continuous source region by ion implantation under the above described conditions. By performing a conventional ion implantation from approximately vertical direction additionally to the above described process steps, the resistance can further be lowered.

EXAMPLE 1

Figure 4:
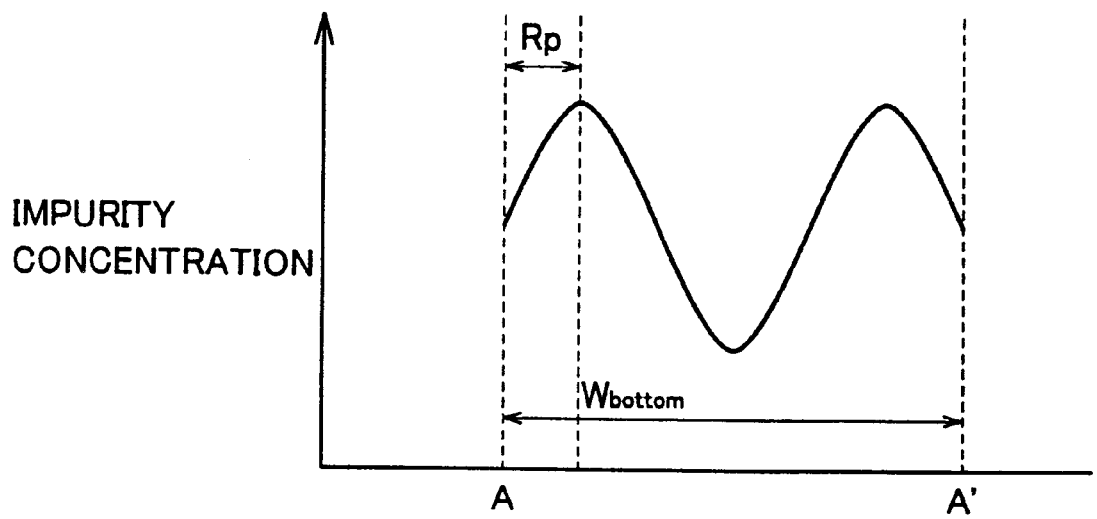
FIG. 4 shows an impurity concentration distribution along the line A–A' of FIG. 1 of the source diffusion layer region in accordance with Example 1 of the present invention.

An example will be described in which the present invention is applied to a non-volatile semiconductor memory device in which memory cell pitch in the word line direction is 0.5 $\mu$m, the width Wbottom of the lower surface of the protrusion is 0.2 $\mu$m, the width of the bottom surface of the recess is 0.3 $\mu$m, the depth of the recess is 0.3 $\mu$m and an angle formed by the bottom surface and sidewall of the recess is 90°. FIG. 4 represents impurity concentration at the lower portion of the protrusion (the line A–A' of FIG. 1) at the surface of the semiconductor substrate of the present example. In the present example, the angle formed by the bottom surface and the sidewall of each recess is 90°, and the width and depth of the bottom surface of the recess have the same length. Therefore, when the angle of ion implantation is set to 45°, ions can be implanted to an intersection between the bottom surface and sidewall of the recess. When the impurity implanted for forming the source diffusion layer region 2 is arsenic, it is known that (Rp+3ΔRp) of the ions in the horizontal direction is about 0.1 μm when the ions are implanted at an angle of 45° as mentioned above with the implantation energy of 120 keV. Preferable ion dosage at this time is about $5 \times 10^{13}$ to about $5 \times 10^{16}/cm^2$.

By separately performing ion implantation to opposing sidewalls of the recess as the trench under the above described condition, the source diffusion layer region 2 is formed. At this time, at a lower portion of the protrusion, opposing source diffusion layer regions are brought into contact with each other and connected. Accordingly, the highest point of the bottom surface of source region 2a is positioned at least deeper than the bottom surface of the recess. Rp is positioned nearer to the trench than the central portion of the protrusion under the condition of the present example, and hence the impurity concentration has such a distribution as shown in FIG. 4.

EXAMPLE 2

Figure 5:
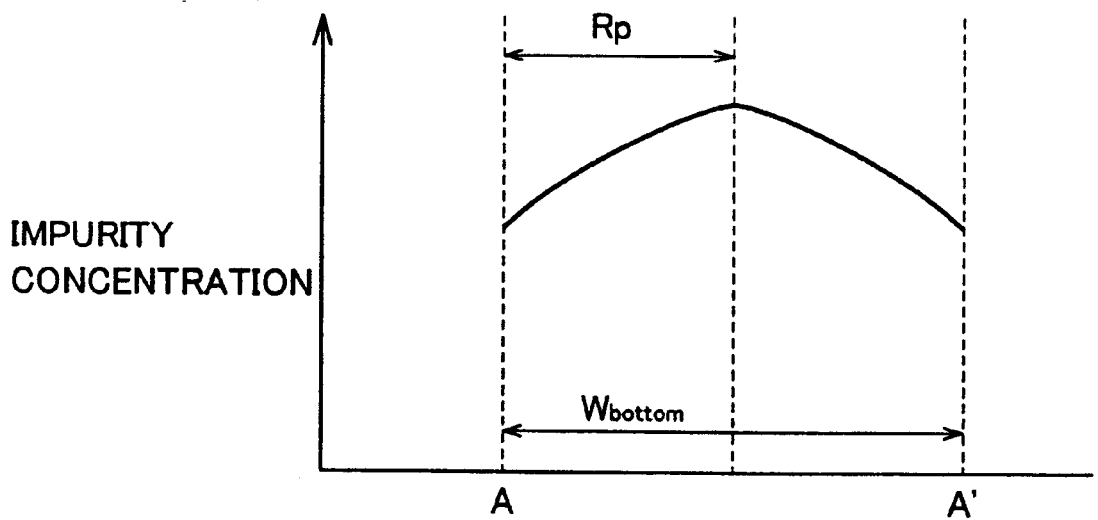
FIG. 5 shows impurity concentration distribution along the line A-A' of FIG. 1 of the source diffusion layer region in accordance with Example 2 of the present invention.
Figure 6:
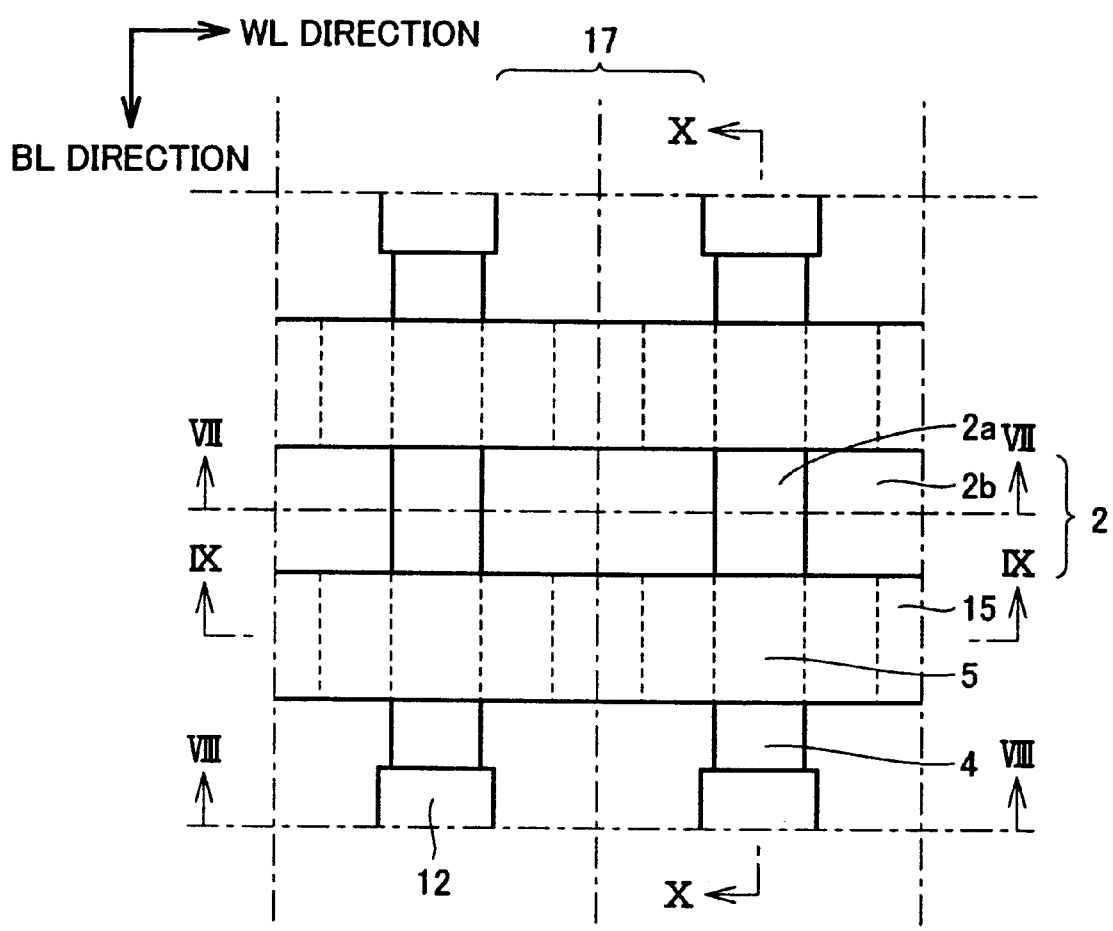
FIG. 6 is a top view of a conventional non-volatile semiconductor memory device.
Figure 7:
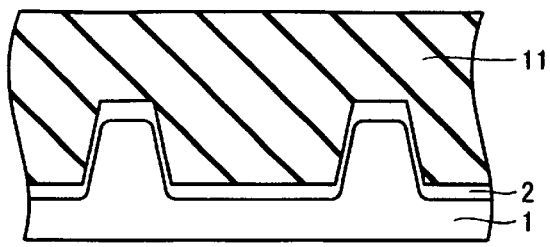
FIG. 7 is a cross section representing a cross sectional structure along the line VII—VII of FIG. 6 of the conventional non-volatile semiconductor memory device.
Figure 8:
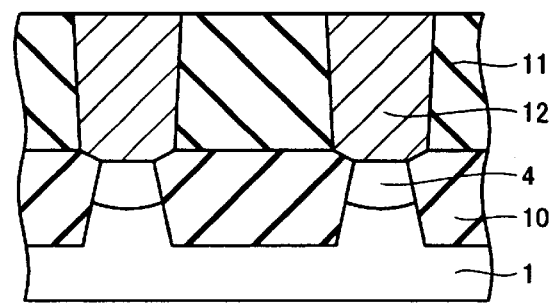
FIG. 8 is a cross section representing a cross sectional structure along the line VIII—VIII of FIG. 6 of the conventional non-volatile semiconductor memory device.
Figure 9:
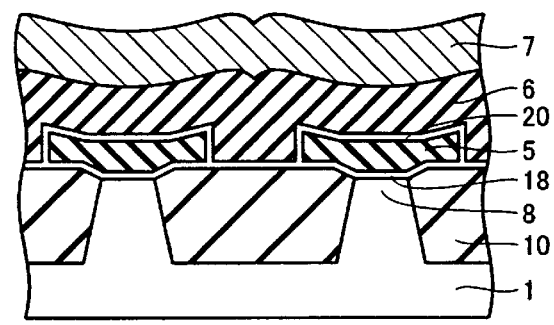
FIG. 9 is a cross section representing a cross sectional structure along the line IX—IX of FIG. 6 of the conventional non-volatile semiconductor memory device.
Figure 10:
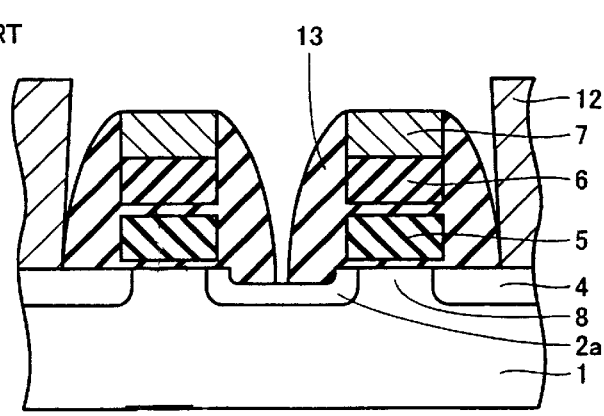
FIG. 10 is a cross section representing a cross sectional structure along the line X—X of FIG. 6 of the conventional non-volatile semiconductor memory device.
Figure 11A:
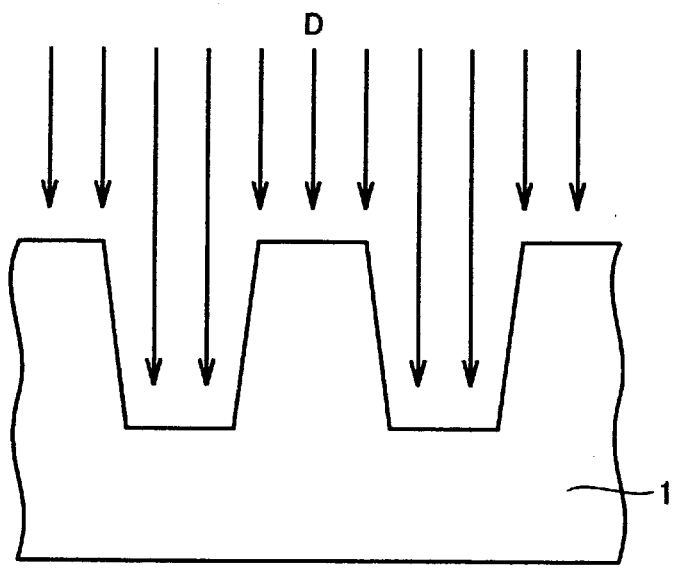
FIGS. 11A and 11B are cross sections representing the method of forming a source diffusion layer region in the conventional non-volatile semiconductor memory device.
Figure 11B:
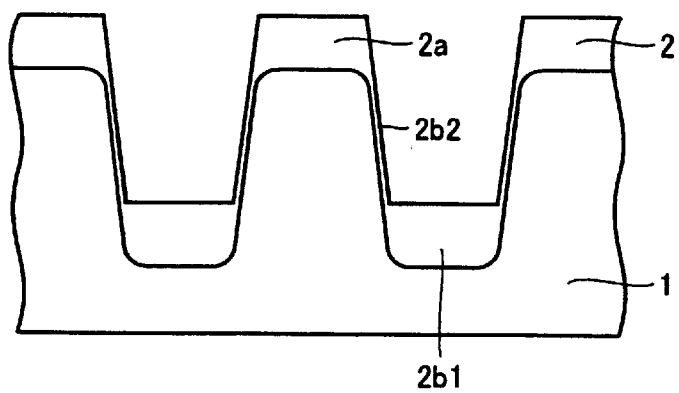

An example will be described in which the present invention is applied to a non-volatile semiconductor memory device in which memory cell pitch in the word line direction is 0.5 μm, the width Wbottom of the lower surface of the protrusion is 0.2 μm, the width of the bottom surface of the recess is 0.3 μm, the depth of the recess is 0.3 μm and an angle formed by the bottom surface and a sidewall of the recess is 90°, as in Example 1 above. FIG. 5 represents impurity concentration of a lower portion of the protrusion (the line A–A' of FIG. 1) of the surface of the semiconductor substrate, similar to that of Example 1 above.

In the present embodiment, as the angle formed by the bottom surface and the sidewall of each recess is 90° and the width and depth of the bottom surface of the recess have the same length, ions can be implanted to the intersection between the bottom surface and the sidewall of the recess when the angle of ion implantation is set to 45°. Further, when the impurity implanted for forming the source diffusion layer region 2 is arsenic, it is known that average range Rp of the ions in the horizontal direction is about 0.1 μm when the ions are implanted at an angle of 45° as mentioned above with an implantation energy of 255 keV. Preferable ion dosage at this time is about $5 \times 10^{13}$ to about $5 \times 10^{16}/cm^2$.

By performing ion implantation to satisfy Wbottom=2× Rp as described above, it is possible to manufacture a non-volatile semiconductor memory device with the lower portion of the protrusion having such an impurity concentration distribution as shown in FIG. 5.

Though ion implantation is performed in a fixed manner twice under the same ion implantation conditions in order to simplify the process steps in the above described examples, the conditions for the two ion implantation operations need not be the same, provided that implantation condition eventually results in a structure in which the bottom surface of the source region formed at the protrusion of the main surface of the semiconductor substrate is positioned at the same depth or lower than the bottom surface of the recess.

Though not described above, when a short channel effect in the direction of the source/drain region is large, a known pocket structure may be provided by introducing a p type impurity such as boron, in order to prevent punch-through. Further, application of the present invention is not limited to a non-volatile semiconductor memory device. The present invention is applicable to any semiconductor device that has a continuous diffusion layer region at the main surface of the semiconductor substrate with the main surface of the semiconductor substrate as the diffusion layer region having recesses and protrusions. The region specified as the source diffusion layer region where the present invention is applied to a non-volatile semiconductor memory device is not limited thereto but covers all general diffusion layer regions including a drain diffusion layer region. In that case, the diffusion layer region formed continuously at the main surface of the semiconductor substrate having recesses and protrusions comes to have lower resistance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device having a source diffusion layer region formed continuously at a main surface of a semiconductor substrate, wherein the main surface of said semiconductor substrate as said source diffusion layer region has, in a cross section parallel to a direction of extension of said source diffusion layer region, recesses and protrusions, formed by trench isolation method, continuously and alternately repeated;

said source diffusion layer region includes a first source diffusion layer region formed, when said semiconductor substrate is viewed two-dimensionally, from an upper surface of each said protrusion to depth direction of said semiconductor substrate, and a second source diffusion layer region formed, when said semiconductor substrate is viewed two-dimensionally, from a bottom surface of said recess to the depth direction of said semiconductor substrate;

depth of a bottom surface of said first source diffusion layer region from the upper surface of said protrusion is equal to or larger than depth of a bottom surface of each said recess from the upper surface of the protrusion; and depth of a shallowest portion in the depth direction of the first source diffusion layer region from the under surface of the protrusion is equal to or larger than a deepest portion of the recess in the depth direction from the upper surface of the protrusion.

2. The non-volatile semiconductor memory device according to claim 1, wherein in said first source diffusion layer region, impurity concentration distribution of a linear portion connecting lower ends of sidewalls forming each said protrusion has one peak between a mid point of the linear portion and one of the lower ends and another peak between the mid point and the other lower end.

3. The non-volatile semiconductor memory device according to claim 1, wherein in said first source diffusion layer region, impurity concentration distribution of a linear portion connecting lower ends of sidewalls forming each said protrusion has a peak near a mid point of the linear portion.

* * * * *

UNITED STATES PATENT AND TRADEMARK OFFICE
CERTIFICATE OF CORRECTION

PATENT NO. : 6,670,666 B2
DATED : December 30, 2003
INVENTOR(S) : Satoshi Shimizu It is certified that error appears in the above-identified patent and that said Letters Patent is hereby corrected as shown below:

Title page,
Item [73], Assignee, change "Mitsubishi Denki Kabushiki Kaisha" to
-- Renesas Technology, Corp. --.

Signed and Sealed this

Fifth Day of April, 2005

JON W. DUDAS
*Director of the United States Patent and Trademark Office*